United States Patent [19]
Freidin

[11] Patent Number: 5,661,660
[45] Date of Patent: Aug. 26, 1997

[54] METHOD FOR PROVIDING MULTIPLE FUNCTION SYMBOLS

[75] Inventor: Philip M. Freidin, Sunnyvale, Calif.

[73] Assignee: Xilinx, Inc., San Jose, Calif.

[21] Appl. No.: 239,675

[22] Filed: May 9, 1994

[51] Int. Cl.$^6$ ............................................. G06F 17/50
[52] U.S. Cl. ...................... 364/489; 364/488; 364/490; 364/578
[58] Field of Search ................................. 364/488, 489, 364/490, 491, 578, 579; 395/325

[56] References Cited

U.S. PATENT DOCUMENTS

| | | | |
|---|---|---|---|
| 5,267,187 | 11/1993 | Hsieh et al. | 364/784 |
| 5,317,698 | 5/1994 | Chan | 395/325 |
| 5,339,262 | 8/1994 | Rostoker et al. | 364/578 |
| 5,343,406 | 8/1994 | Freeman et al. | 364/490 |
| 5,432,719 | 7/1995 | Freeman et al. | 364/579 |
| 5,448,493 | 9/1995 | Topolewski et al. | 364/489 |
| 5,499,192 | 3/1996 | Knapp et al. | 364/489 |

OTHER PUBLICATIONS

"Schematic Design User's Guide", Viewlogic Systems, Inc., Version C, Workview 4.1, Series I, May 1991.
Programmable Logic Data Book, available from Xilinx, Inc., 2100 Logic Drive, San Jose, Ca 95124, 1994, pp. 2–9 through 2–18.

Primary Examiner—Kevin J. Teska
Assistant Examiner—Russell W. Frejd
Attorney, Agent, or Firm—Jeanette S. Harms

[57] ABSTRACT

Logic is represented in a schematic capture program as a generic symbol. The generic symbol represents a single underlying logic circuit, thereby decreasing library space. The generic symbol includes a configuration memory which is represented on the symbol by a plurality of pins. The generic symbol is configured by indicating the logic signals placed on the plurality of pins. In this manner, the generic symbol significantly increases the design choices available to the end user. Moreover, the generic symbol allows access to the underlying logic of the circuit via the selected bit pattern, thereby advantageously permitting the end user to perform functional simulation within the schematic environment. In one embodiment, a plug symbol is provided to schematically connect to the generic symbol. This plug symbol represents a predetermined pattern of bits, thereby significantly simplifying configuring the logic in the schematic capture program.

11 Claims, 4 Drawing Sheets

METHOD FOR PROVIDING MULTIPLE FUNCTION SYMBOLS

BACKGROUND OF THE INVENTION

1. Field of the Invention

The present invention relates to a symbol used in a schematic capture program, and in particular to a multiple function symbol that is configurable during schematic capture.

2. Description of the Related Art

Embedding carry logic in high level components, such as counters, adders, and comparators, for schematic capture programs is well known in the art. For example, FIG. 1 illustrates one high level component, a counter 100, which is provided by a schematic capture symbol library which in turn is incorporated into an FPGA design program. Counter 100, which includes embedded carry logic, has been available to the end user only as a hard macro. A hard macro provides fully partitioned and placed design fragments, thereby optimizing performance for the end user.

However, irrespective of the desirability of known performance, unless this hard macro provides exactly the resources needed by the end user, certain inefficiencies occur. For example, assume the library of the schematic capture program includes 8- and 16-bit counter hard macros. If the end user needs a 10-bit counter, the end user must choose between using the 16-bit counter, thereby wasting 6 bits, or using the 8-bit counter, thereby necessitating the building of 2 extra bits. To build these two extra bits, the end user must access another program to create a new hard macro, and then use a translator to provide the new hard macro in the FPGA design program.

Because of the complexity of designing a new hard macro, a large library of commonly used hard macros is typically provided. However, each hard macro includes substantially the same underlying circuitry, thereby significantly increasing the space needed for the library. Moreover, after a hard macro is selected, it allows no access to its underlying logic, thereby undesirably preventing any simulation of the carry logic during schematic capture. Therefore, a need arises for a method which allows an end user to easily design a carry logic circuit, minimizes library space, and allows simulation during schematic capture.

SUMMARY OF THE INVENTION

In accordance with the present invention, logic is represented as a generic symbol in a schematic capture program. The generic symbol represents a single underlying logic circuit, thereby dramatically decreasing library space in comparison to prior art hard macros. In accordance with the present invention, the generic symbol includes a configuration memory which is represented on the symbol by at least one pin. The generic symbol is configured by indicating the logic signals (the bit pattern) placed on the pin(s). In one embodiment, eight pins are provided on the generic symbol, thereby providing 256 logic modes. Therefore, in contrast to the prior art which is limitedly the number of hard macros in the library and the number of hard macros created by the end user in a time-consuming and complicated design process, the present invention significantly increases the design choices available to the end user. Moreover, the generic symbol allows access to the underlying logic via the selected bit pattern, thereby advantageously permitting the end user to perform functional simulation within the schematic environment.

In further accordance with the present invention, a plug is provided to schematically connect to the generic symbol. This plug represents a predetermined bit pattern, thereby significantly simplifying the process of configuring the logic in the schematic capture program. In one embodiment, a plurality of plugs are provided, each plug determining the specific logic mode.

DETAILED DESCRIPTION OF THE DRAWINGS

Figure 1:
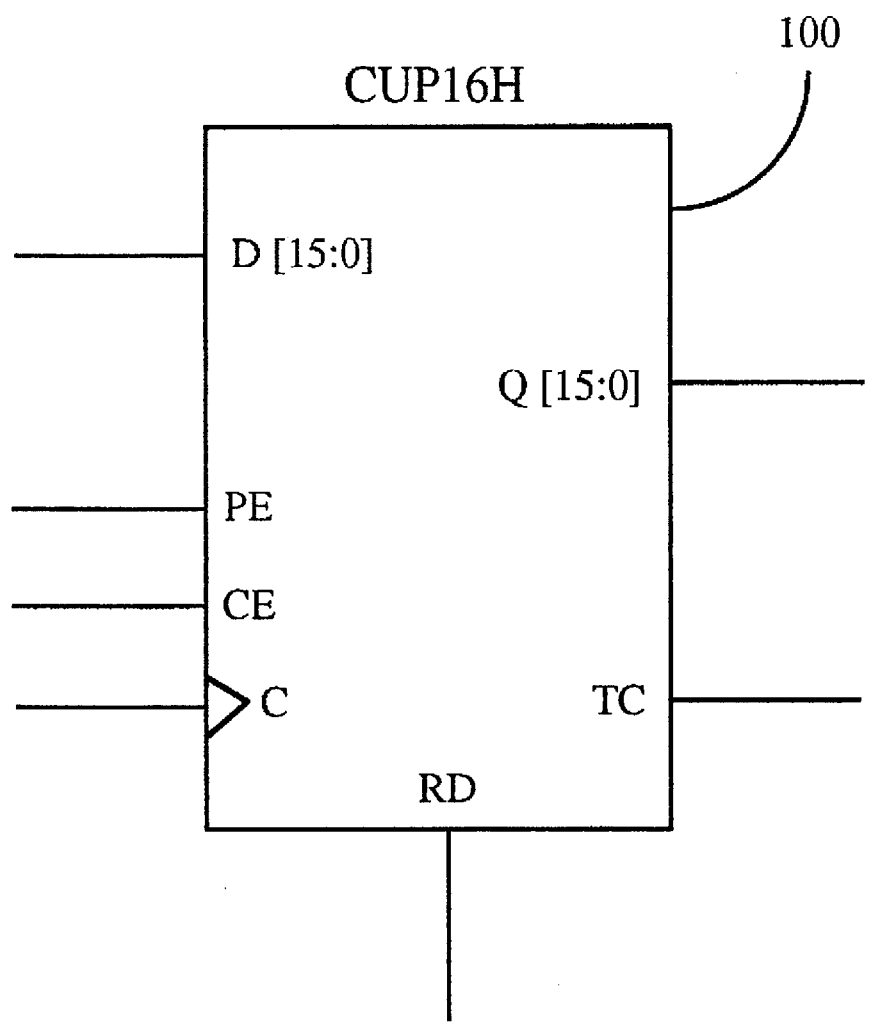
FIG. 1 illustrates a counter, which includes embedded carry logic, provided as a hard macro in a known schematic capture program.
Figure 2:
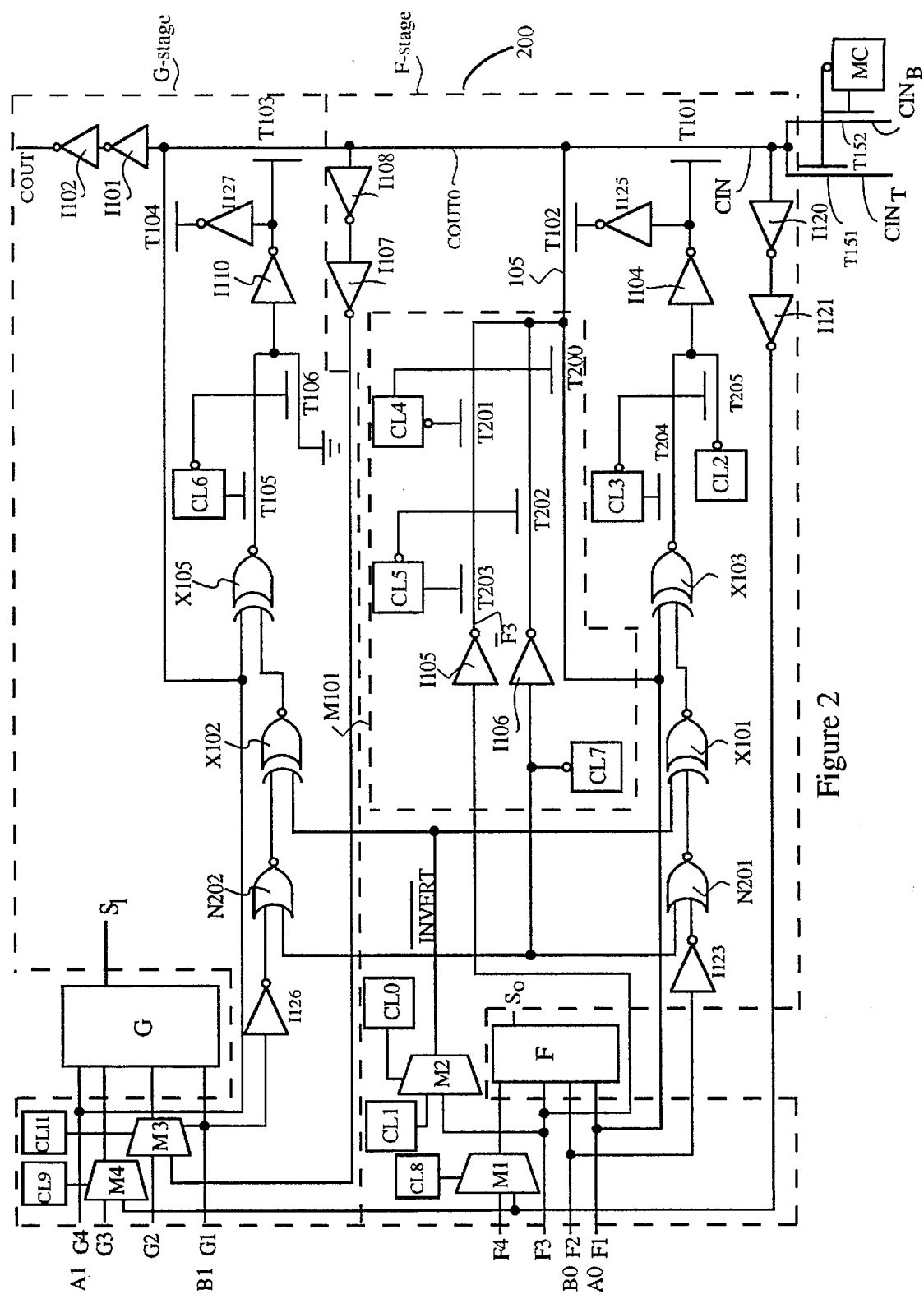
FIG. 2 shows a carry logic circuit which is configured with a plurality of configuration bits.

FIG. 2 illustrates one embodiment of a carry logic circuit 200 which is part of a configurable logic block (CLB) of a field programmable gate array (FPGA). CLBs and FPGAs are explained in detail in pages 2–9 through 2–18 of the 1994 Programmable Logic Data Book, incorporated herein by reference, published by Xilinx, Inc. located at 2100 Logic Drive, San Jose, Calif. 95124. Carry logic circuit 200 includes eight configuration bits CL0–CL7, wherein varying the logic state of these configuration, bits provides a number of different carry logic modes, as described in detail below.

Configuration bit CL0 determines whether carry logic circuit 200 functions in either the increment/add mode, the decrement/subtract mode, or both modes. Configuration bit CL0 controls how the selection between these three modes is made. Note that the selection can be either static (under the control of configuration bit CL1) or dynamic (under the control of the signal on input line F3). In the increment/add mode, the input signal B0 is propagated through inverter I123, then through NOR gate N201, and then through an exclusive NOR (XNOR) gate X101 to XNOR gate X103. To provide this propagation, multiplexer M2, controlled by configuration bit CL0, outputs a logic one. Signal B0 is inverted by inverter I123, then restored to its original value by NOR gate N201. Because of the logic one provided by multiplexer M2, XNOR gate X101 passes this signal without further inversion to exclusive NOR gate X103. Note that configuration bit CL1, which provides an input signal to multiplexer M2, is typically used to provide a static value, whereas input line F3, which provides the other input signal to multiplexer M2, provides a dynamically changing signal. In the decrement/subtract mode, multiplexer M2 outputs a logic zero, thereby inverting the input signal B0 via XNOR gate X101.

For carry logic circuit 200 to operate as an intermediate stage in a multi-bit adder, configuration bits CL2–CL5 are set to provide logic ones. In this manner, the output signal of XNOR gate X103 is transferred to inverter I104, and the combination of XNOR gate X103 and inverter I104 act as an XOR gate.

Setting configuration bit CL4 to a logic one turns off transistor T201 and turns on transistor T200, thereby transferring the signal A0 on input line F1 to line 105. In this manner, if transistor T102 turns on and transistor T101 turns off (i.e. signals A0 and B0 are equal), then signal A0 is propagated to carry out line COUT0. Setting configuration bit CL5 to a logic one prevents the signal provided by configuration bit CL7 from simultaneously being propagated to line 105.

On the other hand, setting configuration bit CL3 to a logic zero turns off transistor T204 and turns on transistor T205. Thus, the signal provided by configuration bit CL2 controls whether transistors T101 and T102 conduct. Specifically, if configuration bit CL2 is set to a logic one, a logic zero is provided to inverter I104 and a logic one is provided to inverter I125. Therefore, a logic one is provided to the gate of transistor T101, thereby turning on this transistor, and a logic zero is provided to the gate of transistor T102, thereby turning off this transistor. In this manner, one of the signals on carry in lines $CIN_T$ or $CIN_B$ propagates to carry out line COUT0. Thus, the signal on carry out line COUT0 skips the carry logic of the F-stage. This configuration is particularly useful if layout constraints require a particular stage in a logic block to be used for something other than a stage in the adder (or counter, etc.).

On the other hand, if configuration bit CL2 is set to a logic zero (still assuming configuration bit CL3 is set to a logic zero signal), transistor T101 turns off and transistor T102 turns on, thereby propagating the signal on line 105 to carry out line COUT0. Note that configuration bits CL4, CL5, and CL7 determine the signal provided on line 105.

For the F-stage to add the least significant bit in a multi-bit adder, the carry-in signal is preset to logic zero by applying a logic zero to either of carry in lines $CIN_T$ or $CIN_B$, and setting memory cell MC to Propagate that signal. Alternatively, to preset the carry-in signal of the G-stage (i.e. the signal on carry out line COUT0), either the signal on line F3 (inverted by inverter I105), the signal provided by configuration bit CL7, or the signal on input terminal F1 is used. Specifically, if configuration bits CL4 and CL5 are set to logic zeros, the signal of configuration bit CL7 is provided on line 105. If configuration bits CL4 and CL5 are set to a logic zero and a logic one, respectively, the complement of the signal on line F3 is provided on line 105. However, if configuration bits CL4 and CL5 provide logic ones, the signal on input line F1 is provided on line 105. In this configuration, configuration bits CL2 and CL3 are set to logic zeros, thereby turning off transistor T101 and turning on transistor T102. In this manner, the signal on line 105 propagates to carry out line COUT0 (the carry in line for the G-stage).

In addition to functioning as a part of the 3:1 multiplexer M101, configuration bit CL7 provides input signals to NOR gates N201 and N202. For the F-stage to function as an intermediate stage in a multi-bit adder for adding signals A0 and B0 on lines F1 and F2, Configuration bit CL7 is set to a logic one. In this manner, NOR gate N201 outputs signal B0 on input line F2. To add a constant to signal A0 on line F1, configuration bit CL7 is set to a logic zero, thereby forcing the input signal of NOR gate N201 high. Forcing the input signal high in turn forces the output signal of NOR gate N201 low, thereby passing the addend selected by multiplexer M2 to be inverted on the output of XNOR gate X101. Multiplexer M2, controlled by configuration bit CL0, selects either the signal provided by configuration bit CL1 or the signal on input line F3, and provides the selected signal to XNOR gate X101. Thus, by setting configuration bit CL7 to a logic zero, a bit is programmed to a constant value, which in turn is added to an input value without using the interconnect resources (not shown) connected to input line F2, thereby freeing up those resources to carry signals to other CLBs.

As shown in FIG. 2, the F-stage and the G-stage are cascaded together, each stage representing one bit of a multi-bit adder. Much of the carry logic of the G-stage is identical to the carry logic of the F-stage. For example, XNOR gate X102 of the G-stage functions analogously to XNOR gate X101 of the F-stage. Additionally, NOR gate N202 of the G-stage functions similarly to NOR gate N201 of the F-stage. However, instead of configuration bits CL2 and CL3 in the F-stage, the G-stage includes only one configuration bit CL6. If configuration bit CL6 is set high, transistor T105 turns on and transistor T106 turns off. In this manner, the G-stage functions as an intermediate stage in a multi-bit adder. On the other hand, if configuration bit CL6 is set low, transistor T105 turns off and transistor T106 turns on, thereby transferring a low signal to inverter I110. This low signal, inverted by inverter I110, turns off transistor T104 and turns on transistor T103, thereby allowing the signal on carry out line COUT to bypass the carry logic of the G-stage.

Carry logic circuit 200 and the effect of configuration bits CL0—CL7 are described in further detail in U.S. Pat. No. 5,267,187, issued Nov. 30, 1993, which is herein incorporated by reference in its entirety.

Figure 3:
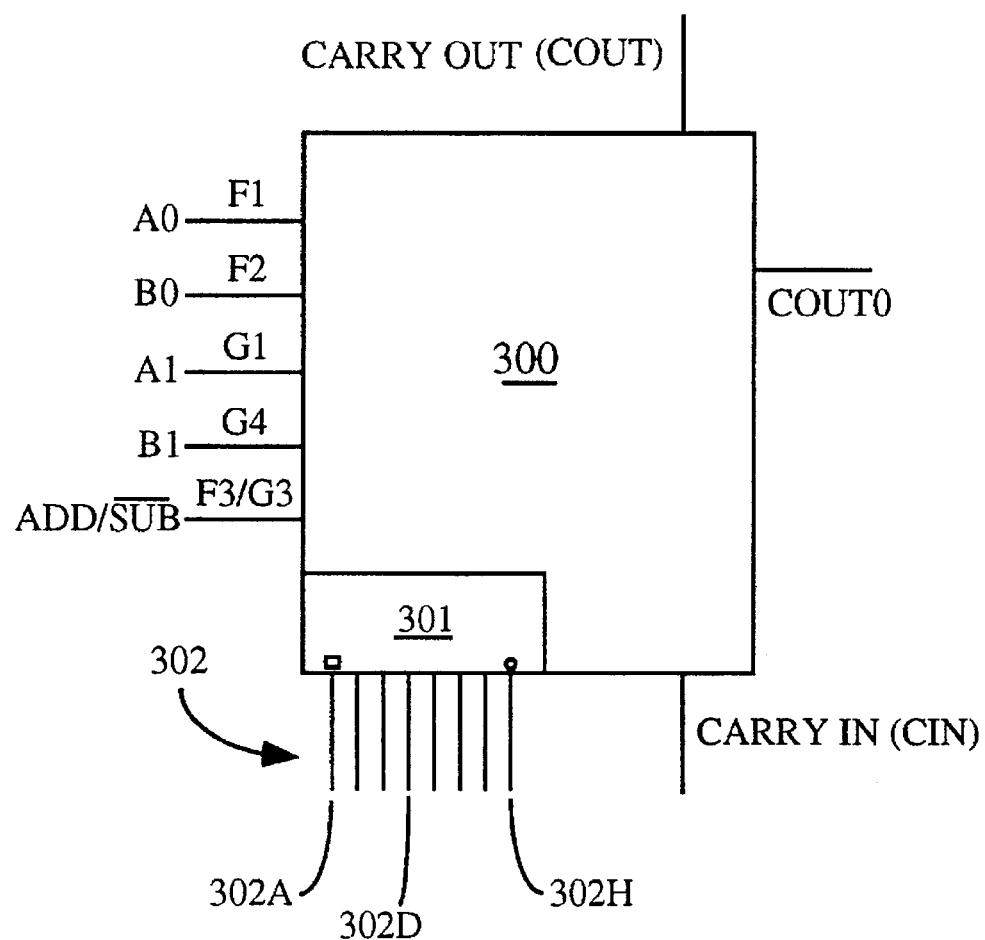
FIG. 3 illustrates a carry logic symbol in accordance with the present invention.

In accordance with the present invention, the carry logic which was previously embedded in hard macros or was configurable at the chip editor level (i.e. at a very low level), is now configurable at the primitive symbol level within a schematic, thereby providing an efficient and simple method of designing with carry logic. FIG. 3 illustrates one embodiment of a generic carry logic symbol 300 in accordance with the present invention. Carry logic symbol 300 includes input lines F1, F2, G4, and G1 (receiving signals A0, B0, A1, and B1 of FIG. 2), as well as carry-in line CIN and carry-out lines COUT0 and COUT (see also FIG. 2). Note that because the end user determines whether the carry in signal is provided by the CLB positioned above (via carry in line $CIN_T$) or below (via carry in line $CIN_B$) the portion of the CLB shown including the F-stage and the G-stage, only one carry in line CIN is provided. In one embodiment, carry logic symbol 300 also includes an input line ADD/$\overline{SUB}$ which selectively receives the signals on input lines F3 and G3. These signals, which must be provided to both the F and G function generators, control whether carry logic circuit 200 (FIG. 2) operates in an addition mode or a subtraction mode. Note that input lines G2 and F4 to the G and F generators, respectively, are not included in carry logic symbol 300 because these input lines do not affect the carry logic.

In accordance with the present invention, generic carry logic symbol 300 includes a carry mode programmer 301, thereby completing the generic structure of carry logic circuit 200 (FIG. 2). Carry logic programmer 301 includes pins 302A–302H, each pin having a one to one correspondence with configuration bits CL0–CL7, respectively. Thus, for example, a logic one provided to pin 302A corresponds to the same signal stored by configuration bit CL0 and a logic zero provided to pin 302H corresponds to the same signal stored by configuration bit CL7 (FIG. 2).

In one embodiment, the end user configures generic carry logic symbol 300 by indicating the logic signals to be stored by configuration bits CL0–CL7 by assigning pins 302A–302H, respectively, to either a logic one voltage source VCC or a logic zero voltage source GND (neither shown). After the VCC or GND signals are selectively provided to pins 302A–302H of generic carry logic symbol 300, a particular carry logic mode results. For example, to provide a carry mode "ADD-FG-CI" (explained in detail in Table 1), a bit pattern of "01011111" is provided to pins 302A–302H, respectively. Thus, in this implementation, pins 302A and 302C are connected to ground, and the remaining pins are connected to logic one voltage source VCC. Because the present invention provides a simulation mode for each carry logic mode (via the bit pattern), the end user is able to do functional simulation within the schematic environment, thereby efficiently verifying the FPGA design before place and route operations.

Figure 4:
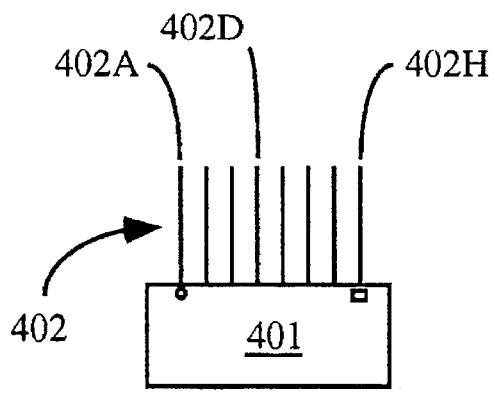
FIG. 4 shows an illustrative plug for connecting to the carry logic symbol.

In accordance with another embodiment of the present invention and referring to FIG. 4, a "plug" 401 is provided to schematically "connect" to carry mode programmer 301 of generic carry logic symbol 300. Specifically, plug 401 includes a plurality of pins 402A–402H which have a one to one correspondence to pins 302A–302H, respectively, and to configuration bits CL0–CL7, respectively.

In one embodiment, a plurality of plugs 401 are provided, each plug 401 representing a predetermined pattern of bits to be provided to pins 302A–302H of generic carry logic symbol 300 (FIG. 3). In this embodiment, each plug provides predetermined logic low and high signals on pins 402A–402H in accordance with the carry modes detailed in Appendix Table 1.

Table 1 explains a plurality of carry logic modes corresponding to a plurality of bit patterns provided by plugs 401. Note that although there are theoretically 256 carry logic modes (provided by the eight configuration bits CL0–CL7), only 43 modes have practical functionality in a typical field programmable gate array (FPGA). Thus, in accordance with one embodiment of the present invention, there are 43 plugs provided in the schematic capture program. Thus, in accordance with this embodiment of the present invention, plug 401 and corresponding Table 1 significantly simplify configuring carry logic in a schematic capture symbol library.

To further optimize the schematic capture program, conventional logic trimming of the new carry logic symbol is provided. Logic trimming is well known in the art and therefore is not described herein in detail.

Figure 5:
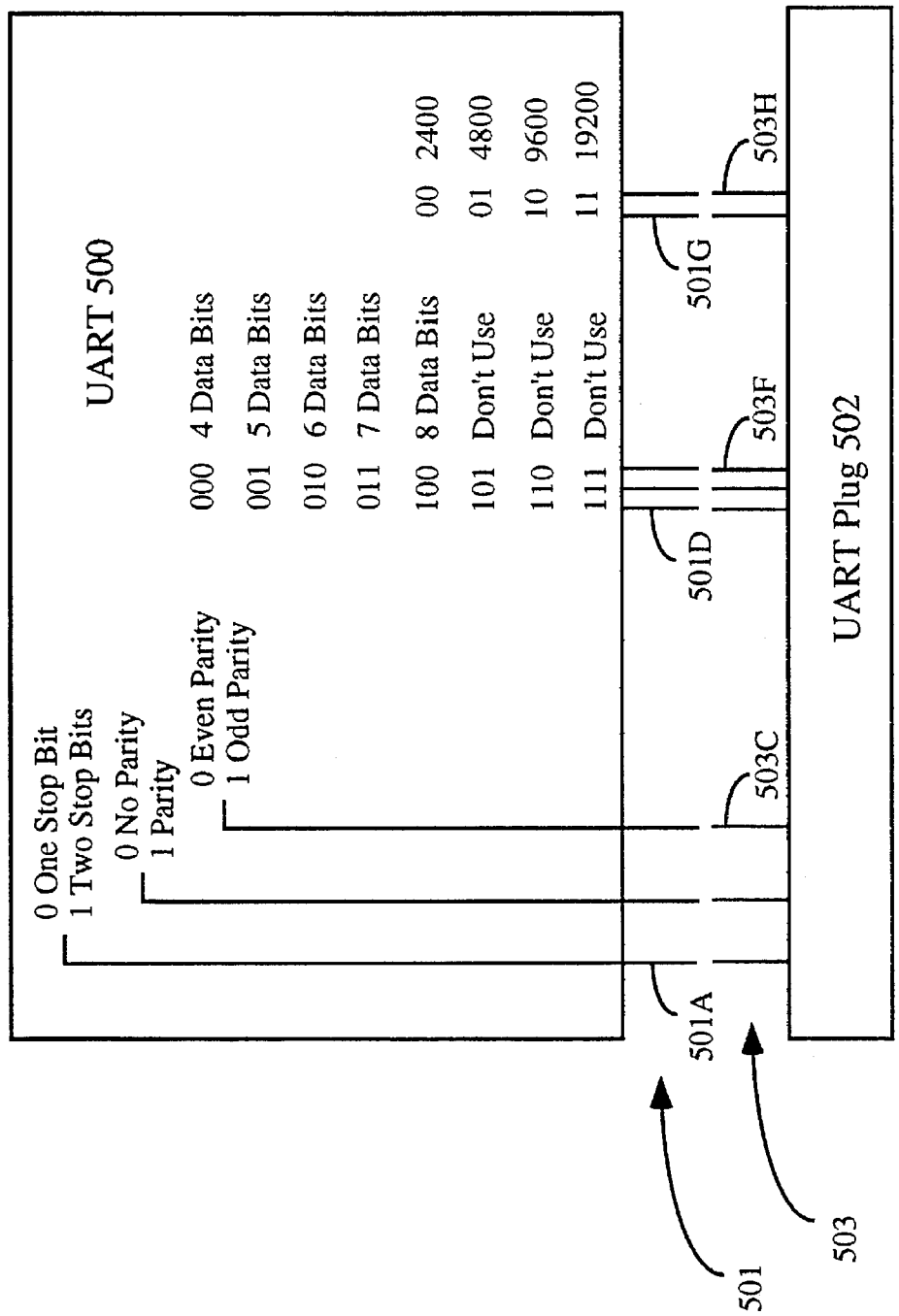
FIG. 5 illustrates a UART symbol and a UART configuration plug in accordance with the present invention.

The present invention is applicable to any symbol configurable by a series of bits or by a plug. For example, in one embodiment shown in FIG. 5, a UART 500 is configured with a plug 502. Specifically, plug 502 includes a plurality of pins 503A–503H which have a one to one correspondence to pins 501A–501H, respectively, of UART 500. Each bit provided by pins 501A–501H to pins 501A–501H configures a parameter of UART 500. For example, a logic zero provided to pin 501A indicates that UART 500 has one stop bit, whereas a logic one provided to pin 501A indicates that UART 500 has two stop bits. The bits provided to the following pins indicate other parameters associated with UART 500: a bit provided to pin 501B indicates parity or no parity, a bit provided to pin 501C indicates even parity or odd parity, bits provided to pins 501D–501F indicate the number of or lack of data bits, and bits provided to pins 501G–501H indicate the baud rate. Thus, if UART plug 502 provides the bit pattern "01010001" on pins 503A–503H, respectively, then UART 500 is configured to have one stop bit, even parity, 8 data bits, and operate at 4800 baud.

The embodiments described above are illustrative only and not limiting. Other embodiments of the present invention will be apparent to those skilled in the art of schematic capture. The present invention is set forth in the appended claims.

TABLE 1

Introduction

The term Carry Logic refers to a feature of the XC4000 family architecture that allows a Carry signal from an arithmetic operation to be passed from CLB to its neighbor. The Carry Logic allows the implementation of adders, subtractors, accumulators, counters and comparators that are significantly faster than implementations made from only CLB function generators.
This Table 1 covers the following:
1.0      Structure of Carry Logic
- In the CLB
- In the LCA (CLB to CLB connections)

2.0      CLB Definitions of Carry Logic Configurations
- Adders
- Subtractors
- Adders/Subtractors
- Incrementers
- Decrementers
- Incrementers/Decrementers
- Force and Examine Carry
- Overflow
- Summary of Carry Mode Codes 1.0 Structure of Carry Logic Configuration Bits
The Carry Logic is controlled by 8-bits (CL0–CL7). Programming these bits determines the function of the Carry Logic. Of the 256 possible configurations of the Carry Logic, only 39 are known to be valid. Each valid mode has been given a mnemonic. A few valid modes have been give more than one mnemonic, for a total of 42 "different" modes.
The ConfigCarry command in the XACT Design Editor (XDE) is used to configure the Carry Logic for a CLB. Selecting the appropriate mnemonic configures the CLB Carry Logic to perform a given function. Default equations are placed in the function generators. These may be altered, if desired, to create different logic loadable counter for example. The different carry configurations are described in Part II of this document.

TABLE 1-continued

Carry Logic Signals
The Carry Logic connects to the CLB pins listed below. Possible uses for the pins are shown to the right.

| | |
|---|---|
| F1 | Operand A0. Carry-in for LSB of adders, counters, et cetera. |
| F2 | Operand B0. Synchronous Reset or Parallel Enable for counters. |
| F3 | Up/Down control. Add/Subtract control. Enable for counters. |
| F4 | Signal on CIN pin. Signal from interconnect (F4I). |
| G1 | Operand B1. |
| G2 | COUT0 from F Carry Logic. Signal from interconnect (G2I). |
| G3 | Signal on CIN pin. Signal from interconnect (G3I). |
| G4 | Operand A1. |
| CIN | Sourced by CLB Above (MC=0, Down) or CLB Below (MC=1, Up). |
| COUT | Sources CIN pin of adjacent CLB. |

Carry Logic Connections from CLB to CLB
Except for CLBs in the top and bottom rows, the Carry Out (COUT) output from a CLB connects to the Carry In (CIN) input of the CLB above and below. CLBs in the top-most row, connect to the CLB below and the CLB to the right. CLBs in the bottom-most row, connect to the CLB above and the CLB to the right.

2.0 CLB Definitions of Carry Logic Configurations

To configure a CLB so that it uses the Carry Logic requires the programming of several elements. These elements include:
- the F and/or G Function Generators
- the source of the F4, G2 and G3 inputs to the Function Generators
- the 8-bit binary code that configures the Carry Logic functions (COUT0 and COUT1)
- the source of CIN (from the CLB above (MC=0) or below (MC=1)

With the exception of the source for CIN, the above elements are programmed when the ConfigCarry mnemonic is selected. Only the Carry Logic code is fixed by the ConfigCarry mnemonic. The F and G function generators and the source of the F4, G2 and G3 inputs are programmed to the defaults for that mode, but may be altered by the user.

The mnemonic consists of three parts: the function type, the CLB function generators used, and the source of the carry signal. For instance, the mnemonic ADD-FG-CI is an add function that uses both the F and G function generator and gets its carry in signal from the CI input.

This section defines the 42 different carry configurations. There are 42 different mnemonics, but there are some duplications, so there are only 39 unique codes. The example below shows how the different elements of each configuration are programmed. For simulation, models of the Carry Logic function are also shown below.

| | |
|---|---|
| ConfigCarry Tag | ADD-FG-CI |
| CLB Comment | The ADD-FG-CI configuration performs an add of A and B in both the F and G Function Generators . . . |
| F Function Generator | F=(F1@F2)@F4 |
| F Carry Function | COUT0=(F1*F2) + CIN*(F1+F2) |
| G Function Generator | G=(G4@G1)@G2 |
| G Carry Function | COUT=COUT1=(G4*G1) + COUT0*(G4+G1) |
| Code | Code=01011111 (CL0 ¤ CL7) |
| Source for F4 | F4=CIN or F4I   (F4I is F4 from Interconnect) |
| Source for G2 | G2=COUT0 or G2I   (G2I is G2 from Interconnect) |
| Source for G3 | G3=CIN or G3I   (G3I is G3 from Interconnect) |
| Source for CIN | CIN = from CLB (MC=0) above or below (MC=1) |
| Delay F1 to COUT | F1 Delay = TOPCY |
| Delay F2 to COUT | F2 Delay = TOPCY |
| Delay F3 to COUT | F3 Delay = (path not used by carry mode) |
| Delay G4 to COUT | G4 Delay = TOPCY |
| Delay G1 to COUT | G1 Delay = TOPCY |

2.1 Adders

The Adder configurations are based on the following full-adder equations:

$$S = A \oplus B \oplus Ci$$
$$Co = A \cdot B + Ci \cdot (A + B)$$

These equations and the following Adder configurations assume an active-High carry signal (0=no carry, 1=carry).

ADD-F-CI

The ADD-F-CI configuration performs an add of A and B in the F Function Generator, with A0 on the F1 pin and B0 on the F2 pin. The carry signal enters on the CIN pin, propagates through the F Carry Logic, and exists on the COUT pin. This configuration can be used as the MSB of an adder, with an optional twos complement overflow calculated in the G Function Generator.

F=(F1@F2)@F4
COUT0=(F1*F2) + CIN*(F1+F2)
G=
COUT=COUT1=COUT0
Code=01011101 (CL0 ¤ CL7)
F4=CIN
G2=G2I or COUT0

TABLE 1-continued

G3=G3I or CIN (CIN is optional for performing overflow, G=G2@G3)
CIN = MC=1 or 0
F1 Delay = TOPCY
F2 Delay = TOPCY
F3 Delay =
G4 Delay =
G1 Delay =
ADD-FG-CI
The ADD-FG-CI configuration performs an add of A and B in both the F and G
Function Generators, with A0 on the F1 pin, B0 on the F2 pin, A1 on the G4 pin, and
B1 on the G1 pin. The carry signal enters on the CIN pin, propagates through the F
and G Carry Logic, and exits on the COUT pin. This configuration comprises the
middle bits of an adder.
F=(F1@F2)@F4
COUT0=(F1*F2) + CIN*(F1+F2)
G=(G4@G1)@G2
COUT=COUT1=(G4*G1) + COUT0*(G4+G1)
Code=01011111 (CL0 ¤ CL7)
F4=CIN
G2=COUT0
G3=G3I or CIN
CIN = MC=1 or 0
F1 Delay = TOPCY
F2 Delay = TOPCY
F3 Delay =
G4 Delay = TOPCY
G1 Delay = TOPCY
.ADD-G-F1
The ADD-G-F1 configuration performs an add of A and B in the G Function
Generator, with A1 on the G4 pin and B1 on the G1 pin. The carry signal enters on
the F1 pin, propagates through the G Carry Logic, and exits on the COUT pin. This
configuration comprises the LSB of an adder where the carry-in signal is routed to
F1. The F Function Generator is not used.
F=
COUT0=F1
G=(G4@G1)@G2
COUT=COUT1=(G4*G1) + COUT0*(G4+G1)
Code=01001111 (CL0 ¤ CL7)
F4=F4I
G2=COUT0
G3=G3I
CIN =
F1 Delay = TINCY
F2 Delay =
F3 Delay =
G4 Delay = TOPCY
G1 Delay = TOPCY
ADD-G-CI
The ADD-G-CI configuration performs an add of A and B in the G Function
Generator, with A1 on the G4 pin and B1 on the G1 pin. The carry signal enters on
the CIN pin, propagates through the G Carry Logic, and exits on the COUT pin. This
configuration is for the middle bit of an adder where the F Function Generator is
reserved for another purpose.
F=
COUT0=CIN
G=(G4@G1)@G2
COUT=COUT1=(G4*G1) + COUT0*(G4+G1)
Code=01100011 (CL0 ¤ CL7)
F4=F4I or CIN
G2=COUT0
G3=G3I or CIN
CIN = MC=1 or 0
F1 Delay =
F2 Delay =
F3 Delay =
G4 Delay = TOPCY
G1 Delay = TOPCY
ADD-G-F3-
The ADD-G-F3- configuration performs an add of A and B in the G Function
Generator, with A1 on the G4 pin and B1 on the G1 pin. The carry signal enters on
the F3 pin, gets inverted by the F Carry Logic, propagates through the G Carry Logic,
and exits on the COUT pin. This configuration comprises the LSB of an adder
where the inverted carry-in signal is routed to F3. The F Function Generator is not
used.
F=
COUT0=~F3
G=(G4@G1)@G2
COUT=COUT1=(G4*G1) + COUT0*(G4+G1)
Code=01000111 (CL0 ¤ CL7)

TABLE 1-continued

```
F4=F4I
G2=COUT0
G3=G3I
CIN =
F1 Delay =
F2 Delay =
F3 Delay = TINCY
G4 Delay = TOPCY
G1 Delay = TOPCY
```

2.2 Subtractors

The Subtractor configurations are based on the following full-subtractor equations:

$$S = \sim(A \approx B \approx Ci)$$
$$Co = A\cdot\sim B + Ci\cdot(A + \sim B)$$

The result of the subtraction is A−B. Ci and Co represent the borrow-in and borrow-out signals. These equations and the following Subtractor configurations assume an active-Low borrow signal (0=borrow, 1=no borrow).

SUB-F-CI

The SUB-F-CI configuration performs a twos complement subtract of A−B in the F Function Generator, with A0 on the F1 pin and B0 on the F2 pin. The carry signal enters on the CIN pin, propagates through the F Carry Logic, and exits on the COUT pin. This configuration can be used as the MSB of a subtractor, with an optional twos complement overflow calculated in the G Function Generator.

```
F=(F1@F2)@~F4=~(F1@F2@F4)
COUT0=(F1*~F2) + CIN*(F1+~F2)
G=
COUT1=COUT0
Code=00011101 (CL0 ¤ CL7)
F4=CIN
G2=G2I or COUT0
G3=G3I or CIN (CIN is optional for performing overflow, G=G2@G3)
CIN = MC=1 or 0
F1 Delay = TOPCY
F2 Delay = TOPCY
F3 Delay =
G4 Delay =
G1 Delay =
```

SUB-FG-CI

The SUB-FG-CI configuration performs a twos complement subtract of A−B in both the F and G Function Generators, with A0 on the F1 pin, B0 on the F2 pin, A1 on the G4 pin, and B1 on the G1 pin. The carry signal enters on the CIN pin, propagates through the F and G Carry Logic, and exits on the COUT pin. This configuration comprises the middle bits of a subtractor.

```
F=(F1@F2)@~F4=~(F1@F2@F4)
COUT0=(F1*~F2) + CIN*(F1+~F2)
G=(G4@G1)@~G2=~(G4@G1@G2)
COUT=COUT1=(G4*~G1) +COUT0*(G4+~G1)
Code=00011111 (CL0 ¤ CL7)
F4=CIN
G2=COUT0
G3=G3I or CIN
CIN = MC=1 or 0
F1 Delay = TOPCY
F2 Delay = TOPCY
F3 Delay =
G4 Delay = TOPCY
G1 Delay = TOPCY
```

.SUB-G-1

The SUB-G-1 configuration performs a twos complement subtract of A−B in the G Function Generator, with A1 on the G4 pin and B1 on the G1 pin. The carry-in is tied High (no borrow). The carry signal propagates through the G Carry Logic, and exits on the COUT pin. This configuration comprises the LSB of a subtractor with no carry-in. The F Function Generator is not used.

```
F=
COUT0=1
G=(G4@G1)
COUT=COUT1=(G4+~G1)
Code=00000011 (CL0 ¤ CL7)
F4=F4I
G2=G2I or COUT0
G3=G3I
CIN =
F1 Delay =
F2 Delay =
F3 Delay =
G4 Delay = TOPCY
G1 Delay = TOPCY
```

.SUB-G-F1

The SUB-G-F1 configuration performs a twos complement subtract of A−B in the G

TABLE 1-continued

Function Generator, with A1 on the G4 pin and B1 on the G1 pin. The carry signal
enters on the F1 pin, propagates through the G Carry Logic, and exits on the COUT
pin. This configuration comprises the LSB of a subtractor where the carry-in signal
is routed to F1. The F Function Generator is not used.
F=
COUT0=F1
G=(G4@G1)@~G2=~(G4@G1@G2)
COUT=COUT1=(G4*~G1) + COUT0*(G4+~G1)
Code=00001111 (CL0 ¤ CL7)
F4=F4I
G2=COUT0
G3=G3I
CIN =
F1 Delay = TINCY
F2 Delay =
F3 Delay =
G4 Delay = TOPCY
G1 Delay = TOPCY
SUB-G-CI
The SUB-G-CI configuration performs a twos complement subtract of A−B in the G
Function Generator, with A1 on the G4 pin and B1 on the G1 pin. The carry signal
enters on the CIN pin, propagates through the G Carry Logic, and exits on the COUT
pin. This configuration is for the middle bit of a subtractor where the F Function
Generator is reserved for another purpose.
F=
COUT0=CIN
G=(G4@G1)@~G2=~(G4@G1@G2)
COUT=COUT1=(G4*~G1) + COUT0*(G4+~G1)
Code=00100011 (CL0 ¤ CL7)
F4=F4I or CIN
G2=COUT0
G3=G3I or CIN
CIN = MC=1 or 0
F1 Delay =
F2 Delay =
F3 Delay =
G4 Delay = TOPCY
G1 Delay = TOPCY
.SUB-G-F3-
The SUB-G-F3- configuration performs a twos complement subtract A−B in the G
Function Generator, with A1 on the G4 pin and B1 on the G1 pin. The carry signal
enters on the F3 pin, gets inverted by the F Carry Logic, propagates through the G
Carry Logic, and exits on the COUT pin. This configuration comprises the LSB of a
subtractor where the inverted carry-in signal is routed to F3. The F Function
Generator is not used.
F=
COUT0=~F3
G=(G4@G1)@~G2=~(G4@G1@G2)
COUT=COUT1=(G4*~G1) + COUT0*(G4+~G1)
Code=00000111 (CL0 ¤ CL7)
F4=F4I
G2=COUT0
G3=G3I
CIN =
F1 Delay =
F2 Delay =
F3 Delay = TINCY
G4 Delay = TOPCY
G1 Delay = TOPCY
2.3 Adder/Subtractors The Adder/Subtractor configurations are based on the following equations:
   S    =    ~(A ≈ B ≈ Ci ≈ ADD)
   Co   =    ADD·[A·B + Ci·(A + B)] + ~ADD·[A~B + Ci·(A + ~B)]
In these equations, the ADD signal indicates Add (ADD=1) or Subtract (ADD=0). In
Subtract mode, the result is A−B and Ci and Co represent the borrow-in and
borrow-out signals. These equations and the following Adder/Subtractor
configurations assume an active-High carry signal (0=no carry, 1=carry) and an
active-Low borrow signal (0=borrow, 1=no borrow).
ADDSUB-F-CI
The ADDSUB-F-CI configuration performs a twos complement add/subtract of A±B
in the F Function Generator, with A0 on the F1 pin and B0 on the F2 pin. The carry
signal enters on the CIN pin, propagates through the F Carry Logic, and exits on the
COUT pin. The F3 input indicates Add (F3=1) or Subtract (F3=0). This configuration
can be used as the MSB of an adder/subtractor, with an optional twos complement
overflow calculated in the G Function Generator.
F=(F1@F2)@F4@~F3=~(F1@F2@F4@F3)
COUT0=F3*((F1*F2) + CIN*(F1+F2)) + ~F3*((F1*~F2) + CIN*(F1+~F2))
G=

TABLE 1-continued

```
COUT=COUT0
Code=1001110 (CL0 ¤ CL7)
F4=CIN
G2=G2I or COUT0
G3=G3I or CIN (CIN is optional for performing overflow, G=G2@G3)
CIN = MC=1 or 0
F1 Delay = TOPCY
F2 Delay = TOPCY
F3 Delay = TASCY
G4 Delay =
G1 Delay =
ADDSUB-FG-CI
The ADDSUB-FG-CI configuration performs a twos complement add/subtract of
A±B in both the F and G Function Generators, with A0 on the F1 pin, B0 on the F2
pin, A1 on the G4 pin, and B1 on the G1 pin. The carry signal enters on the CIN pin,
propagates through the F and G Carry Logic, and exits on the COUT pin. The F3 and
G3 inputs indicate Add (F3=G3=1) or Subtract (F3=G3=0): the Add/Subtract control
signal must be routed to both the F3 and G3 pins. This configuration comprises the
middle bits of an adder/subtractor.
F=(F1@F2)@F4@~F3=~(F1@F2@F4@F3)
COUT0=F3*((F1*F2) + CIN*(F1+F2)) + ~F3*((F1*~F2) + CIN*(F1+~F2))
G=(G4@G1)@G2@~G3=~(G4@G1@G2@G3)
COUT=COUT1=F3*((G4*G1)+COUT0*(G4+G1))+~F3*((G4*~G1)+COUT0*(G4+~G1))
Code=10011111 (CL0 ¤ CL7)
F4=CIN
G2=COUT0
G3=G3I
CIN = MC=1 or 0
F1 Delay = TOPCY
F2 Delay = TOPCY
F3 Delay = TASCY
G4 Delay = TOPCY
G1 Delay = TOPCY
ADDSUB-G-F1
The ADDSUB-G-F1 configuration performs a twos complement add/subtract of A±B
in the G Function Generator, with A1 on the G4 pin and B1 on the G1 pin. The
carry signal enters on the F1 pin, propagates through the G Carry Logic, and exits on
the COUT pin. The F3 and G3 inputs indicate Add (F3=G3=1) or Subtract (F3=G3=0):
the Add/Subtract control signal must be routed to both the F3 and G3 pins. This
configuration comprises the LSB of an adder/subtractor where the carry-in signal is
routed to F1. The F Function Generator is not used.
F=
COUT0=F1
G=(G4@G1)@G2@~G3=~(G4@G1@G2@G3)
COUT=COUT1=F3*((G4*G1)+COUT0*(G4+G1))+~F3*((G4*~G1)+COUT0*(G4+~G1))
Code=10001111 (CL0 ¤ CL7)
F4=F4I
G2=COUT0
G3=G3I
CIN =
F1 Delay = TINCY
F2 Delay =
F3 Delay = TASCY
G4 Delay = TOPCY
G1 Delay = TOPCY
ADDSUB-G-CI
The ADD-SUB-G-CI configuration performs a twos complement add/subtract of A±B
in the G Function Generator, with A1 on the G4 pin and B1 on the G1 pin. The
carry signal enters on the CIN pin, propagates through the G Carry Logic, and exits
on the COUT pin. The F3 and G3 inputs indicate Add (F3=G3=1) or Subtract
(F3=G3=0): the Add/Subtract control signal must be routed to both the F3 and G3
pins. This configuration is for the middle bit of an adder/subtractor where the F
Function Generator is reserved for another purpose.
F=
COUT0=CIN
G=(G4@G1)@G2@~G3=~(G4@G1@G2@G3)
COUT=COUT1=F3*((G4*G1)+COUT0*(G4+G1))+~F3*((G4*~G1)+COUT0*(G4+~G1))
Code=10100011 (CL0 ¤ CL7)
F4=F4I or CIN
G2=COUT0
G3=G3I
CIN = MC=1 or 0
F1 Delay =
F2 Delay =
F3 Delay = TASCY
G4 Delay = TOPCY
G1 Delay = TOPCY
ADDSUB-G-F3-
The ADD-SUB-G-F3- configuration performs a twos complement add/subtract of
```

TABLE 1-continued

A±B in the G Function Generator, with A1 on the G4 pin and B1 on the G1 pin. The carry signal enters on the F3 pin, gets inverted by the F Carry Logic, propagates through the G Carry Logic, and exits on the COUT pin. Because the F3 input also indicates Add (F3=1) or Subtract (F3=0), the carry-in is always null (0 for add, 1 for subtract). This configuration comprises the LSB of an adder/subtractor with no carry-in. The F Function Generator is not used.
F=
COUT0=~F3
G=(G4@G1)
COUT=COUT1=F3*G4*G1 + ~F3(G4+~G1)
Code=10000111 (CL0 ¤ CL7)
F4=F4I
F2=G2I or COUT0
G3=G3I
CIN =
F1 Delay =
F2 Delay =
F3 Delay = TASCY (greater than TINCY)
G4 Delay = TOPCY
G1 Delay = TOPCY

2.4 Incrementers

The Incrementer configurations are based on the following equations:
$$S = A \approx Ci$$
$$Co = A \cdot Ci$$
In these equations, A represents the number to be incremented.
If the INC carry logic modes are used to construct a counter, the CLB flip-flops should be connected as shown below. The current state of each bit is fed back to the Function Generator, which calculates the next state of the bit.

INC-F-CI
The INC-F-CI configuration performs an increment in the F Function Generator, with A0 on the F1 pin. The carry signal enters on the CIN pin, propagates through the F Carry Logic, and exits on the COUT pin. The G Function Generator may be used to output the Terminal Count of a counter.
F=(F1@F4)
COUT0=CIN*F1
G=
COUT1=COUT0
Code=01011100 (CL0 ¤ CL7)
F4=CIN
G2=G2I or COUT0
G3=G3I or CIN (CIN is optional for performing overflow, G=G2@G3)
CIN = MC=1 or 0
F1 Delay = TOPCY
F2 Delay =
F3 Delay =
G4 Delay =
G1 Delay =

INC-FG-CI
The INC-FG-CI configuration performs an increment in both the F and G Function Generators, with A0 on the F1 pin and A1 on the G4 pin. The carry signal enters on the CIN pin, propagates through the F and G Carry Logic, and exits on the COUT pin. This configuration comprises the middle bits of an incrementer.
F=(F1@F4)
COUT0=CIN*F1
G=(G4@G2)
COUT=COUT1=COUT0*G4
Code=01011110 (CL0 ¤ CL7)
F4=CIN
G2=COUT0
G3=G3I or CIN
CIN = MC=1 or 0
F1 Delay = TOPCY
F2 Delay =
F3 Delay =
G4 Delay = TOPCY
G1 Delay =

INC-G-1
The INC-G-1 configuration performs an increment in the G Function Generator, with A1 on the G4 pin. The carry-in is tied High. The carry signal propagates through the G Carry Logic, and exits on the COUT pin. This configuration comprises the LSB of an incrementer that is always enabled. The F Function Generator is not used. This configuration is identical to DEC-G-0 since the LSB of an incrementer is identical to the LSB of a decrementer.
F=
COUT0=0
G=~(G4)
COUT=COUT1=G4
Code=00000010 (CL0 ¤ CL7)

TABLE 1-continued

F4=F4I
G2=G2I or COUT0
G3=G3I
CIN =
F1 Delay =
F2 Delay =
F3 Delay =
G4 Delay = TOPCY
G1 Delay =
INC-G-F1
The INC-G-F1 configuration performs an increment in the G Function Generator,
with A1 on the G4 pin. The carry signal enters on the F1 pin, propagates through
the G Carry Logic, and exits on the COUT pin. This configuration comprises the LSB
of an incrementer where F1 is an active High enable. The F Function Generator is
not used.
F=
COUT0=F1
G=(G4@G2)
COUT=COUT1=COUT0*G4
Code=01001110 (CL0 ¤ CL7)
F4=F4I
G2=COUT0
G3=G3I
CIN =
F1 Delay = TINCY
F2 Delay =
F3 Delay =
G4 Delay = TOPCY
G1 Delay =
INC-G-CI
The INC-G-CI configuration performs an increment in the G Function Generator,
with A1 on the G4 pin. The carry signal enters on the CIN pin, propagates through
the G Carry Logic, and exits on the COUT pin. This configuration is for the middle
bit of an incrementer where the F Function Generator is reserved for another
purpose.
F=
COUT0=CIN
G=(G4@G2)
COUT=COUT1=COUT0*G4
Code=01100010 (CL0 ¤ CL7)
F4=F4I or CIN
G2=COUT0
G3=G3I or CIN
CIN = MC=1 or 0
F1 Delay =
F2 Delay =
F3 Delay =
G4 Delay = TOPCY
G1 Delay =
INC-G-F3-
The INC-G-F3- configuration performs an increment in the G Function Generator,
with A1 on the G4 pin. The carry signal enters on the F3 pin, gets inverted in the F
Carry Logic, propagates through the G Carry Logic, and exits on the COUT pin. This
configuration comprises the LSB of an incrementer where F3 is an active Low
enable. The F Function Generator is not used.
F=
COUT0=~F3
G=(G4@G2)
COUT=COUT1=COUT0*G4=~F3*G4
Code=01000110 (CL0 ¤ CL7)
F4=F4I
G2=COUT0
G3=G3I
CIN =
F1 Delay =
F2 Delay =
F3 Delay = TINCY
G4 Delay = TOPCY
G1 Delay =
INC-FG-1
The INC-FG-1 configuration performs an increment in both the F and G Function
Generator, with A0 on the F1 pin and A1 on the G4 pin. The carry-in is tied High.
The carry signal propagates through the F and G Carry Logic, and exits on the COUT
pin. This configuration comprises the two least significant bits of an incrementer
which is always enabled.
F=~(F1)
COUT0=F1
G=G2@G4
COUT=COUT1=COUT0*G4

TABLE 1-continued

Code=01001110 (CL0 ¤ CL7)
F4=F4I
G2=COUT0
G3=G3I
CIN =
F1 Delay = TOPCY
F2 Delay =
F3 Delay =
G4 Delay = TOPCY
G1 Delay =

2.5 Decrementers

The Decrementer configurations are based on the following equations:

$$S = \sim(A \approx Ci)$$
$$Co = A + \sim A \cdot Ci$$

In these equations, A represents the number to be decremented.
If the DEC carry logic modes are used to construct a counter, the CLB flip-flops
should be connected as shown below. The current state of each bit is fed back to the
Function Generator, which calculates the next state of the bit.
DEC-F-CI
The DEC-F-CI configuration performs a decrement in the F Function Generator,
with A0 on the F1 pin. The carry signal enters on the CIN pin, propagates through
the F Carry Logic, and exits on the COUT pin. The G Function Generator may be
used to output the Terminal Count of a counter.
F=~(F1@F4)
COUT0=F1+CIN*~F1
G=
COUT=COUT0
Code=00011100 (CL0 ¤ CL7)
F4=CIN =
G2=G2I or COUT0
G3=G3I or CIN (CIN is optional for performing overflow, G=G2@G3)
CIN = MC=1 or 0
F1 Delay = TOPCY
F2 Delay =
F3 Delay =
G4 Delay =
G1 Delay =
DEC-FG-CI
The DEC-FG-CI configuration performs a decrement in both the F and G Function
Generators, with A0 on the F1 pin and A1 on the G4 pin. The carry signal enters on
the CIN pin, propagates through the F and G Carry Logic, and exits on the COUT
pin. This configuration comprises the middle bits of a decrementer.
F=~(F1@F4)
COUT0=F1+CIN*~F1
G=~(G4@G2)
COUT=COUT1=G4+COUT0*~G4
Code=00011110 (CL0 ¤ CL7)
F4=CIN
G2=COUT0
G3=G3I or CIN
CIN = MC=1 or 0
F1 Delay = TOPCY
F2 Delay =
F3 Delay =
G4 Delay = TOPCY
G1 Delay =
DEC-G-0
THE DEC-G-0 configuration performs a decrement in the G Function Generator,
with A1 on the G4 pin. The carry-in is tied High (no borrow). The carry signal
propagates through the G Carry Logic, and exits on the COUT pin. This
configuration comprises the LSB of a decrementer that is always enabled. The F
Function Generator is not used. This configuration is identical to INC-G-1 since the
LSB of an incrementer is identical to the LSB of a decrementer.
F=
COUT0=0
G=~(G4)
COUT=COUT1=G4
Code=00000010 (CL0 ¤ CL7)
F4=F4I
G2=G2I or COUT0
G3=G3I
CIN =
F1 Delay =
F2 Delay =
F3 Delay =
G4 Delay = TOPCY
G1 Delay =
DEC-G-F1

TABLE 1-continued

The DEC-G-F1 configuration performs a decrement in the G Function Generator, with A1 on the G4 pin. The carry signal enters on the F1 pin, propagates through the G Carry Logic, and exits on the COUT pin. This configuration comprises the LSB of a decrementer where F1 is an active Low enable. The F Function Generator is not used.
F=
COUT0=F1
G=~(G4@G2)
COUT=COUT1=COUT0 + G4
Code=00001110 (CL0 ⋈ CL7)
F4=F4I
G2=COUT0
G3=G3I
CIN =
F1 Delay = TINCY
F2 Delay =
F3 Delay =
G4 Delay = TOPCY
G1 Delay =
DEC-G-CI
The DEC-G-CI configuration performs a decrement in the G Function Generator, with A1 on the G4 pin. The carry signal enters on the CIN pin, propagates through the G Carry Logic, and exits on the COUT pin. This configuration is for the middle bit of a decrementer where the F Function Generator is reserved for another purpose.
F=
COUT0=CIN
G=~(G4@G2)
COUT=COUT1=G4+COUT0*~G4
Code=00100010 (CL0 ⋈ CL7)
F4=F4I or CIN
G2=COUT0
G3=G3I or CIN
CIN = MC=1 or 0
F1 Delay =
F2 Delay =
F3 Delay =
G4 Delay = TOPCY
G1 Delay =
DEC-G-F3-
The DEC-G-F3- configuration performs a decrement in the G Function Generator, with A1 on the G4 pin. The carry signal enters on the F3 pin, gets inverted in the F Carry Logic, propagates through the G Carry Logic, and exits on the COUT pin. This configuration comprises the LSB of a decrementer where F3 is an active High enable. The F Function Generator is not used.
F=
COUT0=~F3
G=~(G4@G2)
COUT=COUT1=COUT0 + G4
Code=00000110 (CL0 ⋈ CL7)
F4=F4I
G2=COUT0
G3=G3I
CIN =
F1 Delay =
F2 Delay =
F3 Delay = TINCY
G4 Delay = TOPCY
G1 Delay =
DEC-FG-0
The DEC-FG-0 configuration performs a 2-bit decrement in both the F and G Function Generator, with the lower-order input on the F1 pin and the higher order input on the G4 pin. The carry-in is tied Low. The carry signal propagates through the F and G Carry Logic, and exits on the COUT pin. This configuration comprises the two least significant bits of a decrementer which is always enabled.
F=~(F1)
COUT0=F1
G=~(G4@G2)
COUT=COUT1=(COUT0*~G4) + G4
Code=00001110 (CL0 ⋈ CL7)
F4=F4I
G2=COUT0
G3=G3I
CIN =
F1 Delay = TOPCY
F2 Delay =
F3 Delay =
G4 Delay = TOPCY
G1 Delay =

TABLE 1-continued 2.6 Incrementer/Decrementers

The Incrementer/Decrementer configurations are based on the following equations:
     S      =     ~(A = Ci = UP)
     Co     =     UP·[A·Ci] + ~UP·[A + Ci]
In these equations, A represents the number to be incremented or decremented.
The UP signal indicates Increment (UP=1) or Decrement (UP=0).
If the INCDEC carry logic modes are used to construct a counter, the CLB flip-flops
should be connected as shown below. The current state of each bit is fed back to the
Function Generator, which calculates the next state of the bit.
INDEC-F-CI
The INDEC-F-CI configuration performs an increment/decrement in the F
Function Generator, with A0 on the F1 pin. The carry signal enters on the CIN pin,
propagates through the F Carry Logic, and exits on the COUT pin. The F3 input
indicates Increment (F3=1) or Decrement (F3=0). The G Function Generator may be
used to output the Terminal Count of a counter.
F=(F1@F4)@~F3
COUT0=~F3*(F1+ CIN) + F3*F1*CIN
G=
COUT=COUT0
Code=10011100 (CL0 ¤ CL7)
F4=CIN
G2=G2I or COUT0
G3=G3I or CIN (CIN is optional for performing overflow, G=G2@G3)
CIN = MC=1 or 0
F1 Delay = TOPCY
F2 Delay =
F3 Delay = TASCY
G4 Delay =
G1 Delay =
INCDEC-FG-CI
The INCDEC-FG-CI configuration performs an increment/decrement in both the F
and G Function Generators, with A0 on the F1 pin and A1 on the G4 pin. The carry
signal enters on the CIN pin, propagates through the F and G Carry Logic, and exits
on the COUT pin. The F3 and G3 inputs indicate Increment (F3=G3=1) or
Decrement (F3=G3=0): the Increment/Decrement control signal must be routed to
both the F3 and G3 pins. This configuration comprises the middle bits of an
incrementer/decrementer.
F=(F1@F4)@~F3
COUT0=~F3*(F1+ CIN) + F3*F1*CIN
G=(G4@G2)@~G3
COUT=COUT1=~F3*(G4+ COUT0) + F3*G4*COUT0
Code=10011110 (CL0 ¤ CL7)
F4=CIN
G2=COUT0
G3=G3I
CIN = MC=1 or 0
F1 Delay = TOPCY
F2 Delay =
F3 Delay = TASCY
G4 Delay = TOPCY
G1 Delay =
INCDEC-G-0
The INCDEC-G-0 configuration performs an increment/decrement in the G
Function Generator, with A1 on the G4 pin. The carry-in is tied High. The carry
signal propagates through the G Carry Logic, and exits on the COUT pin. This
configuration comprises the LSB of an incrementer/decrementer that is always
enabled. The F Function Generator is not used. F3 in not required for
Increment/Decrement control, since the LSB of an incrementer is identical to the
LSB of a decrementer: this configuration is identical to INC-G-1 and DEC-G-0.
F=
COUT0=0
G=~(G4)
COUT=COUT1=G4
Code=00000010 (CL0 ¤ CL7)
F4=F4I
G2=G2I or COUT0
G3=G3I
CIN =
F1 Delay =
F2 Delay =
F3 Delay =
G4 Delay = TOPCY
G1 Delay =
INCDEC-G-F1
The INCDEC-G-F1 configuration performs an increment/decrement in the G
Function Generator, with A1 on the G4 pin. The carry signal enters on the F1 pin,
propagates through the G Carry Logic, and exits on the COUT pin. This
configuration comprises the LSB of an incrementer/decrementer where the carry-in

TABLE 1-continued signal is routed to F1. The carry-in is active High for an increment operation and
active Low for a decrement operation. The F Function Generator is not used. The
F3 and G3 inputs indicate Increment (F3=G3=1) or Decrement (F3=G3=0): the
Increment/Decrement control signal must be routed to both the F3 and G3 pins.
F=
COUT0=F1
G=(G4@G2)@~G3
COUT=COUT1=F3*(G4*COUT0) + ~F3*(G4+COUT0)
Code=10001110 (CL0 ¤ CL7)
F4=F4I
G2=COUT0
G3=G3I
CIN =
F1 Delay = TINCY
F2 Delay =
F3 Delay = TASCY
G4 Delay = TOPCY
G1 Delay =
INCDEC-G-CI
The INCDEC-G-CI configuration performs an increment/decrement in the G
Function Generator, with A1 on the G4 pin. The carry signal enters on the CIN pin,
propagates through the G Carry Logic, and exits on the COUT pin. The F3 and G3
inputs indicate Increment (F3=G3=1) or Decrement (F3=G3=0): the
Increment/Decrement control signal must be routed to both the F3 and G3 pins.
This configuration is for the middle bit of an incrementer/decrementer where the F
Function Generator is reserved for another purpose (although the F3 pin is used by
the carry logic).
F=
COUT0=CIN
G=(G4@G2)@~G3
COUT=COUT1=~F3*(G4+ COUT0) + F3*G4*COUT0
Code=10100010 (CL0 ¤ CL7)
F4=F4I or CIN
G2=COUT0
G3=G3I
CIN = MC=1 or 0
F1 Delay
F2 Delay=
F3 Delay = TASCY
G4 Delay = TOPCY
G1 Delay =
INDEC-FG-1
The INDEC-FG-1 configuration performs a 2-bit increment/decrement in both the
F and G Function Generator, with the lower order input on the F1 pin and the
higher order input on the G4 pin. The F3 and G3 inputs indicate Increment
(F3=G3=1) or Decrement (F3=G3=0): the Increment/Decrement control signal must
be routed to both the F3 and G3 pins. The carry-in is always active (High in
Increment mode and Low in Decrement mode). The carry signal propagates
through the F and G Carry Logic, and exits on the COUT pin. This configuration
comprises the two least significant bits of an incrementer/decrementer which is
always enabled.
F=~(F1)
COUT0=F1
G=(G2@G4)@~G3
COUT=COUT1=~F3*((COUT0*~G4)+G4) + F3*(G4*COUT0)
Code=10001110 (CL0 ¤ CL7)
F4=F4I
G2=COUT0
G3=G3I
CIN =
F1 Delay = TOPCY
F2 Delay =
F3 Delay = TASCY
G4 Delay = TOPCY
G1 Delay =
2.7 Force and Examine Carry FORCE-0
The FORCE-0 configuration forces the carry-out signal on the COUT pin to be 0.
F=
COUT0=0
G=
COUT=COUT1=0
Code=00000000 (CL0 ¤ CL7)
F1 Delay =
F2 Delay =
F3 Delay =
G4 Delay =
G1 Delay =

TABLE 1-continued

FORCE-1
The FORCE-1 configuration forces the carry-out signal on the COUT pin to be 1.
F=
COUT0=1
G=
COUT=COUT1=1
Code=00000001 (CL0 ⋈ CL7)
CIN =
F1 Delay =
F2 Delay =
F3 Delay =
G4 Delay =
G1 Delay =
FORCE-F1
The FORCE-F1 configuration forces the signal on the F1 pin to pass through to the
COUT pin.
F=
COUT0=F1
G=
COUT=COUT1=COUT0=F1
Code=00001100 (CL0 ⋈ CL7)
CIN =
F1 Delay = TINCY
F2 Delay =
F3 Delay =
G4 Delay =
G1 Delay =
FORCE-CI
The FORCE-CI configuration forces the signal on the CIN pin to pass through to the
COUT pin.
F=
COUT0=CIN
G=
COUT=COUT1=COUT0=CIN
Code=00100000 (CL0 ⋈ CL7)
CIN = MC=1 or 0
F1 Delay =
F2 Delay =
F3 Delay =
G4 Delay =
G1 Delay =
FORCE-F3-
The FORCE-F3- configuration forces the signal on the F3 pin to pass inverted to the
COUT pin.
F=
COUT0=~F3
G=
COUT=COUT1=COUT0=~F3
Code=00000100 (CL0 ⋈ CL7)
CIN =
F1 Delay =
F2 Delay =
F3 Delay = TINCY
G4 Delay =
G1 Delay =
EXAMINE-CI
The EXAMINE-CI configuration allows the carry signal on the CIN pin to be used in
the F or G function generators. This configuration forces the signal on the CIN pin
to pass through to the COUT pin, and is equivalent to the FORCE-CI configuration.
EXAMINE-CI is provided for CLBs in which the Carry Logic is unused, but the CIN
signal is required - only the DRC checking is different.
F=
COUT0=CIN
G=
COUT=COUT1=COUT0=CIN
Code=00100000 (CL0 ⋈ CL7)
CIN = MC=1 or 0
F1 Delay =
F2 Delay =
F3 Delay =
G4 Delay =
G1 Delay =
2.8 Twos Complement Overflow In the configurations above that use only the F function generator, a twos
complement overflow can be calculated in the G function generator. Twos
complement overflow is the defined as the exclusive-OR of the Carry-In and the
Carry-Out of the sign bit. The equation for Overflow is:
OFL=Cn @ Cn+1

TABLE 1-continued

Using the G3 input for Cn and the G2 input for Cn+1, the equation is:
G=G3@G2

2.9 Summary of Carry Mode Codes

| CHG | Mnemonic | Code CL0-7 | G3" | G2" | F4" |
|---|---|---|---|---|---|
| | ADD-F-CI | 01011101 | G3I≠ | G2I | CIN |
| | ADD-FG-CI | 01011111 | G3I | COUT0 | CIN |
| | ADD-G-F1 | 01001111 | G3I | COUT0 | F4I |
| | ADD-G-CI | 01100011 | G3I | COUT0 | F4I |
| | ADD-G-F3- | 01000111 | G3I | COUT0 | F4I |
| | SUB-F-CI | 00011101 | G3I≠ | G2I | CIN |
| | SUB-FG-CI | 00011111 | G3I | COUT0 | CIN |
| | SUB-G-1 | 00000011 | G3I | G2I | F4I |
| | SUB-G-F1 | 00001111 | G3I | COUT0 | F4I |
| | SUB-G-CI | 00100011 | G3I | COUT0 | F4I |
| | SUB-G-F3- | 00000111 | G3I | COUT0 | F4I |
| | ADDSUB-F-CI | 10011101 | G3I≠ | G2I | CIN |
| | ADDSUB-FG-CI | 10011111 | G3I | COUT0 | CIN |
| | ADDSUB-G-F1 | 10001111 | G3I | COUT0 | F4I |
| | ADDSUB-G-CI | 10100011 | G3I | COUT0 | F4I |
| | ADDSUB-G-F3- | 10000111 | G3I | COUT0 | F4I |
| | INC-F-CI | 01011100 | G3I | G2I | CIN |
| | INC-FG-CI | 01011110 | G3I | COUT0 | CIN |
| | INC-G-1 | 00000010③ | G3I | G2I | F4I |
| | INC-G-F1 | 01001110 | G3I | COUT0 | F4I |
| | INC-G-CI | 01100010 | G3I | COUT0 | F4I |
| | INC-G-F3- | 01000110 | G3I | COUT0 | F4I |
| | INC-FG-1 | 01001110 | G3I | COUT0 | F4I |
| | DEC-F-CI | 00011100 | G3I | G2I | CIN |
| | DEC-FG-C I | 00011110 | G3I | COUT0 | CIN |
| | DEC-G-0 | 00000010③ | G3I | G2I | F4I |
| | DEC-G-F1 | 00001110 | G3I | COUT0 | F4I |
| | DEC-G-CI | 00100010 | G3I | COUT0 | F4I |
| | DEC-G-F3- | 00000110 | G3I | COUT0 | F4I |
| · | DEC-FG-CI | 00001110 | G3I | COUT0 | F4I |
| | INCDEC-F-0 | 10011100 | G3I | G2I | CIN |
| | INCDEC-FG-CI | 10011110 | G3I | COUT0 | CIN |
| | INCDEC-G-0 | 00000010③ | G3I | G2I | F4I |
| | INCDEC-G-F1 | 10001110 | G3I | COUT0 | F4I |
| | INCDEC-G-CI | 10100010 | G3I | COUT0 | F4I |
| | INCDEC-FG-1 | 10001110 | G3I | COUT0 | F4I |
| · | INCDEC-G-F3- | MODE DELETED | | | |
| | FORCE-0 | 00000000 | G3I | G2I | F4I |
| | FORCE-1 | 00000001 | G3I | G2I | F4I |
| | FORCE-F1 | 00001100 | G3I | G2I | F4I |
| | FORCE-CI | 00100000 | G3I | G2I | F4I |
| | FORCE-F3- | 00000100 | G3I | G2I | F4I |
| | EXAMINE-CI | 00100000 | G3I | G2I | F4I |

① G3, G2 or F4 from interconnect may also come from carry function.
② Overflow may be calculated in the G Function Generator.
③ Identical configurations for the LSB of the INC, DEC and INCDEC.

I claim:

1. A multiple function symbol comprising:
   a generic symbol including underlying logic;
   a configurable memory interface for said generic symbol, wherein said configurable memory interface includes at least one pin, said at least one pin representing a bit for configuring said underlying logic of said multiple function symbol; and
   a plug, wherein said plug includes means for identifying a predetermined configuration for said at least one pin.

2. The multiple function symbol of claim 1 wherein said at least one pin includes eight pins, thereby providing multiple configuration options of said generic symbol.

3. The multiple function symbol of claim 1 wherein said generic symbol is a carry logic symbol.

4. The multiple function symbol of claim 1 wherein said generic symbol is a UART symbol.

5. A carry logic system for schematic capture comprising:
   a generic carry device including:
      a plurality of input lines representing lines of a carry logic circuit for receiving input signals;
      a carry-out line representing a line of said carry logic circuit for providing a carry-out signal; and
      a carry-in line representing a line of said carry logic circuit for providing a carry-in signal; and
   a carry plug receivable by said generic carry device, wherein said plug represents a predetermined set of logic signals to be stored by a plurality of configuration bits in said carry logic circuit.

6. The carry logic symbol of claim 5 wherein said generic carry device includes a plurality of selection lines, each selection line representing a particular configuration bit in said carry logic circuit, wherein said predetermined carry plug determines the bits provided to each of said plurality of selection lines.

7. A system for schematic capture comprising:
   a generic UART symbol including at least one input line for receiving one or more configuration bits; and
   a plug receivable by said generic UART symbol, wherein said plug provides said configuration bits.

8. A system for schematic capture comprising:

a generic symbol including at least one input line for receiving one or more configuration bits; and a plug receivable by said generic symbol, wherein said plug provides said configuration bits.

9. A method of providing multiple functions in a schematic capture operation, said method comprising the steps of:

providing a generic symbol including underlying logic;

providing a plug for identifying a predetermined configuration of said underlying logic; and configuring said generic symbol using said plug.

10. The method of claim 9 wherein said generic symbol is a carry logic symbol.

11. The method of claim 9 wherein said generic symbol is a UART symbol.

* * * * *

UNITED STATES PATENT AND TRADEMARK OFFICE
CERTIFICATE OF CORRECTION

PATENT NO. : 5,661,660
DATED : August, 26, 1997
INVENTOR(S) : Philip M. Freidin It is certified that error appears in the above-identified patent and that said Letters Patent is hereby corrected as shown below:

Col. 17, in Table 1, line 13, delete "F2=G2I..." and insert --G2=G2I...--.

Col. 21, in Table 1, line 30, delete "F4=CIN=" and insert --F4=CIN--.

Col. 27, in Table 1, line 42, delete "INDEC" and insert --INCDEC--.

Col. 27, in Table 1, line 43, delete "INDEC" and insert --INCDEC--.

Col. 27, in Table 1, line 73, after "Code=00000000 (CL0 ¤ CL7)" insert a new line containing --CIN=--.

Col. 31, in Table 1, line 30, delete "DEC-FG-CI" and insert --DEC-FG-0--.

Col. 31, in Table 1, line 31, delete "INCDEC-F-0" and insert --INCDEC-F-CI--.

Signed and Sealed this

Eleventh Day of May, 1999

Attest:

*Attesting Officer*

Q. TODD DICKINSON

*Acting Commissioner of Patents and Trademarks*